United States Patent
Narayanan et al.

(10) Patent No.: US 10,873,023 B2
(45) Date of Patent: Dec. 22, 2020

(54) USING ALUMINUM AS ETCH STOP LAYER

(71) Applicant: Crossbar, Inc., Santa Clara, CA (US)

(72) Inventors: Sundar Narayanan, Cupertino, CA (US); Natividad Vasquez, San Francisco, CA (US); Zhen Gu, Cupertino, CA (US); Yunyu Wang, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 15/468,847

(22) Filed: Mar. 24, 2017

(65) Prior Publication Data

US 2017/0288139 A1    Oct. 5, 2017

Related U.S. Application Data

(60) Provisional application No. 62/316,513, filed on Mar. 31, 2016.

(51) Int. Cl.
    *H01L 45/00*    (2006.01)

(52) U.S. Cl.
    CPC .......... *H01L 45/1233* (2013.01); *H01L 45/04* (2013.01); *H01L 45/1253* (2013.01); *H01L 45/1675* (2013.01)

(58) Field of Classification Search
    CPC .................................................. H01L 45/1675
    See application file for complete search history.

(56) References Cited

U.S. PATENT DOCUMENTS

| | | | |
|---|---|---|---|
| 8,841,196 B1 * | 9/2014 | Harold | H01L 45/085 257/E21.003 |
| 9,172,036 B2 | 10/2015 | Chen et al. | |
| 2003/0176073 A1 * | 9/2003 | Ying | H01L 21/31122 438/710 |
| 2004/0159828 A1 * | 8/2004 | Rinerson | G11C 11/5685 257/2 |
| 2004/0229470 A1 * | 11/2004 | Rui | H01L 21/0332 438/710 |
| 2006/0097341 A1 * | 5/2006 | Pellizzer | H01L 45/1691 257/528 |
| 2007/0190683 A1 * | 8/2007 | Bae | H01L 45/06 438/95 |
| 2007/0249090 A1 * | 10/2007 | Philipp | H01L 45/06 438/102 |

(Continued)

FOREIGN PATENT DOCUMENTS

JP    06104217 A    *    4/1994

OTHER PUBLICATIONS

Taiwanese Office Action and Search Report for Taiwanese Patent Application No. 106111073 dated Nov. 22, 2017, 6 pages(including English translation).

(Continued)

*Primary Examiner* — Cuong Q Nguyen
*Assistant Examiner* — Peter M Albrecht
(74) *Attorney, Agent, or Firm* — Wegman Hessler

(57) ABSTRACT

A two-terminal resistive switching device (TTRSD) such as a non-volatile two-terminal memory device or a volatile two-terminal selector device can be formed according to a manufacturing process. The process can include forming an etch stop layer that is made of aluminum and can include forming a buffer layer below the etch stop layer and/or between the etch stop layer and a top electrode of the TTRSD.

20 Claims, 11 Drawing Sheets

(56) References Cited

U.S. PATENT DOCUMENTS

| | | | |
|---|---|---|---|
| 2009/0029555 A1* | 1/2009 | Oh | G11C 13/0009 |
| | | | 438/703 |
| 2010/0327248 A1* | 12/2010 | Khoueir | H01L 43/08 |
| | | | 257/2 |
| 2011/0186798 A1* | 8/2011 | Kwon | H01L 45/06 |
| | | | 257/2 |
| 2012/0244712 A1* | 9/2012 | Tsubata | H01L 21/0332 |
| | | | 438/703 |

OTHER PUBLICATIONS

Notice of Allowance dated Dec. 17, 2019 for corresponding Chinese Patent Application No. 201710209246.3, 4 pages long.

* cited by examiner

FIRST EXAMPLE TWO-TERMINAL RESISTIVE SWITCHING DEVICE

SECOND EXAMPLE TWO-TERMINAL RESISTIVE SWITCHING DEVICE

EXAMPLE VOLATILE TWO-TERMINAL SELECTOR DEVICE
200

TOP ELECTRODE (TE)
202

TOP ACTIVE METAL LAYER
203

SELECT LAYER
204

BOTTOM ACTIVE METAL LAYER
205

BOTTOM ELECTRODE (BE)
206

SUBSTRATE
208

FIG. 2

USING ALUMINUM AS ETCH STOP LAYER

CROSS-REFERENCE TO RELATED APPLICATIONS

This application claims the benefit of U.S. Provisional Patent Application Ser. No. 62/316,513 filed on Mar. 31, 2016 entitled "USING ALUMINUM AS ETCH STOP LAYER." The entirety of this application is hereby incorporated herein by reference for all purposes.

TECHNICAL FIELD

This disclosure generally relates to integrated circuit devices, as an example: techniques for using aluminum as an etch stop layer in an integrated circuit device.

BACKGROUND

Resistive-switching memory represents a recent innovation within the field of integrated circuit technology. While much of resistive-switching memory technology is in the development stage, various technological concepts for resistive-switching memory have been demonstrated by the inventors and are in one or more stages of verification to prove or disprove associated theories or techniques. The inventors believe that resistive-switching memory technology shows compelling evidence to hold substantial advantages over competing technologies in the semiconductor electronics industry.

The inventors endeavor to develop resistive-switching memory cells that can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for forming layers of a two-terminal resistive switching device. In some embodiments, the two-terminal resistive switching device can be a two-terminal memory device. In some embodiments, the two-terminal resistive switching device can be a two-terminal selector device. Overlaying and in contact with a top terminal/electrode layer of the two-terminal resistive switching device, a buffer layer can be formed. In some embodiments, the buffer layer can comprise TiN. In some embodiments, the buffer layer can have a thickness within a range of between about 100 angstroms to about 150 angstroms. Overlaying and in contact with the buffer layer, an etch stop layer comprising aluminum can be formed. In some embodiments, the etch stop layer has a thickness in a range of between about 100 angstroms to about 200 angstroms. Overlaying and in contact with the etch stop layer, a conductive layer (e.g., a top cap layer) can be formed. In some embodiments, the top cap layer comprises TiN. In some embodiments, the top cap layer has a thickness in a range of between about 300 angstroms to about 500 angstroms.

In some embodiments, a first etching procedure can be implemented to remove a portion of the top cap layer. In response to a signal that indicates the etch stop layer has been exposed, the first etching procedure can terminate. A second etching procedure can be implemented to remove portions of some or all remaining layers. In some embodiments, the second etching procedure can be a chemical etch that uses a chlorine-based compound such as $BCl_3$. In some embodiments, the second etching procedure can be a physical etch configured to mitigate or avoid harm to active metal layers of the two-terminal resistive switching device (TTRSD), such as an argon plasma etch or a $H_2$ plasma etch.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIG. 2 illustrates a block diagram of a second example two-terminal resistive switching device (TTRSD) configured as a two-terminal selector device in accordance with certain embodiments of this disclosure.

DETAILED DESCRIPTION

Introduction

Figure 1:
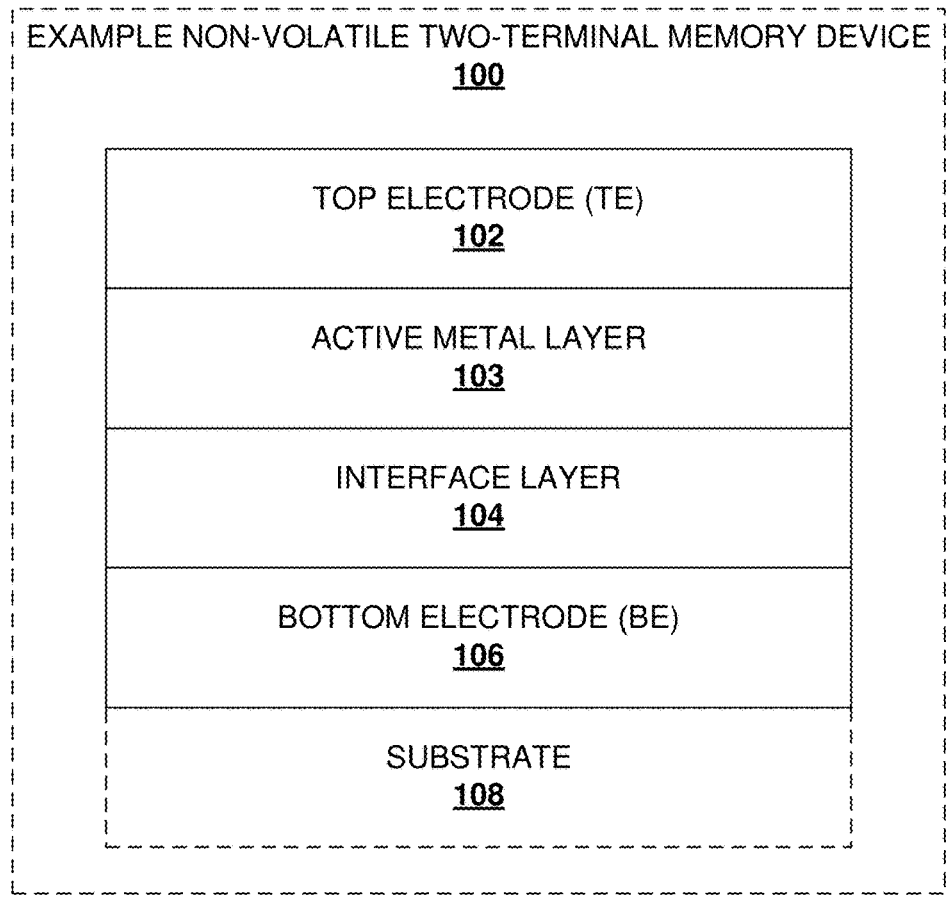
FIG. 1 illustrates a block diagram of a first example two-terminal resistive switching device (TTRSD) configured as a two-terminal memory device in accordance with certain embodiments of this disclosure.

In various embodiments, certain two-terminal resistive switching devices are formed having a top electrode with an overlying titanium nitride (TiN) conductive cap. Etching of TiN is generally accomplished via a chemical etching process that uses boron trichloride ($BCl_3$), chlorine (Cl), or some other suitable chlorine compound. Most two-terminal resistive switching devices have a top electrode (TE) that includes an active metal such as: silver, aluminum, nickel, gold, platinum, or the like, in a form such as: a metallic form, a metallic alloy form, a metallic compound form, or the like. In various embodiments, desired active metal properties of the TE can be diminished, altered, or damaged upon exposure to $BCl_3$, Cl, $Cl_2$, or another chlorine compound or derivative, used for the TiN etching process.

In various embodiments, when patterning and etching a two-terminal resistive switching device, the inventors use an etch stop layer to signal the end of a first (chlorine-based chemical) etching procedure that results in an etch partially through a series of layers and that stops before reaching an electrode of the two-terminal resistive switching device. Subsequently, the inventors use a second (physical) etching procedure to etch the remaining layers. In some embodiments, this two step process, thereby prevents the active metal of one or more electrodes of the two-terminal resistive switching device from being exposed to the chlorine-based chemicals.

This first etching procedure can relatively quickly remove portions of the TiN cap layer with a chemical solution comprising $BCl_3$, Cl, or the like, and terminate as soon as the etch stop layer is reached. The second etching procedure can employ, e.g., an argon (Ar) or hydrogen ($H_2$) plasma in connection with a physical etch such as ion bombardment. In some embodiments, the second etching procedure is generally slower relative to the first etching procedure, but does not harm the active metal properties of the two-terminal resistive switching device.

The inventors have considered a previous use of tungsten (W) as an etch stop layer. For example, another embodiment formed a two-terminal resistive switching device with a TiN cap layer and a tungsten etch stop layer. The inventors have discovered several advances or improvements over these embodiments, which are detailed herein.

For example, the inventors propose herein an etch stop layer comprising aluminum based on advantages of aluminum that the inventors have recently discovered. For example, during manufacture, when the layers are deposited, the manufacturing tool (e.g., a physical vapor deposition tool) has a limited number of vacuum chambers to store those materials being deposited. Since one or more of the electrodes of the two-terminal resistive switching device can comprise aluminum, aluminum material may already be allocated to one of these chambers of the manufacturing tool. In effect, aluminum can have a dual purpose, serving as an electrode (e.g., top electrode "TE") and the etch stop layer that signals the chemical etching procedure to stop. Advantageously, such reduces the number of chambers necessary, as deposition of an aluminum etch stop layer does not consume an additional chamber as would be the case if the etch stop layer comprised tungsten, tantalum nitride, or others. In some embodiments, reducing the number of materials employed in a fabrication process can reduce a likelihood of having to open the vacuum chambers of the physical vapor deposition tool to swap materials out during a fabrication process. Opening the vacuum chambers can break a vacuum seal maintained by the manufacturing tool and/or can unnecessarily expose the integrated circuit device being fabricated to oxidation agents, contaminants, or other undesired elements. This can result in added processing to remove oxidation material or other contaminants, require additional layers such as diffusion mitigation layers, among other steps, increasing the complexity and cost of the fabrication process. Thus, by using fewer materials, more processes can be conducted without opening the vacuum chambers, reducing complexity and cost of the fabrication process.

Additionally, the inventors propose herein a buffer layer (e.g., TiN with a thickness of about 100-150 angstroms) that can be situated between the etch stop layer and the TE of the two-terminal resistive switching device. In a previous embodiment, the tungsten etch stop layer is adjacent to the TE, which potentially leads to certain difficulties. For example, etching potentially required better tolerances than is necessary when the buffer layer is used.

Example Embodiments

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIGS. 1 and 2, two examples of a two-terminal resistive switching device (TTRSD) are depicted. The TTRSD can be a non-volatile device or a volatile device and can be a memory device as illustrated at FIG. 1 or a selector device as illustrated at FIG. 2.

Non-volatile resistive technology can relate to, e.g., a resistive-switching two-terminal memory cell. Resistive-switching two-terminal memory cells (also referred to as resistive-switching memory cells or resistive-switching memory), as utilized herein, comprise circuit components having conductive contacts (e.g., electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a non-volatile resistive switching two-terminal memory device, though not exhaustive, can include a resistive random access memory (RRAM), a phase change RAM (PCRAM) and a magnetic RAM (MRAM).

The state of a TTRSD (whether volatile or non-volatile) is typically determined by electrical characteristics associated with the memory (e.g., conductance, resistance, etc.). For a filamentary TTRSD, these electrical characteristics can be affected by the degree to which a conductive filament is present/absent within the electrically resistive active region. For example, in response to external stimuli (e.g., a suitable voltage applied across the memory device), an electric field is created at or near one or more of the conductive contacts (e.g. active metal layers). This electric field can ionize particles of the conductive contacts and drive those ionized particles into the active region (e.g. interface layer 104, select layer 204, etc.), creating a conductive filament therein. In some embodiments, e.g. FIG. 1, the active region typically can contain a large number of defect sites that trap particles of the conductive filament such that when the external stimuli are removed, the conductive filament remains in the active region. Hence, the device is in a low-resistive and/or high-conductance state in the absence of an external stimulus, and this state is non-volatile. Conversely, to return the memory device to a high-resistive and/or low-conductance state, different external stimuli are applied (e.g., a voltage with different magnitude or polarity, or both), which causes the particles trapped in the active region to drift toward the conductive contact source, breaking electrical continuity of the conductive filament. In other embodiments, e.g. FIG. 2, the active region typically can contain a low number of defect sites, such that particles of a volatile conductive filament that migrate into the active region (e.g., select layer 204) in response to a first external stimuli, can drift out of at least some of the defect sites within the active region in response to a reduction in magnitude of the first external stimuli (e.g., a second external stimuli smaller than the first external stimuli). With different words, the volatile conductive filament can become electrically discontinuous in response to the external stimuli dropping below a deformation magnitude (of the second external stimuli), which is equal to or less than a formation magnitude (of the first external stimuli). As an illustrative example, the volatile device reaches a low-resistive state in response to an activation voltage (or small range of voltages, such as +/− a few tenths of a volt), and returns to a high-resistive state in response to the activation voltage dropping below a deactivation voltage, less than the activation voltage.

Composition of filamentary-based devices can vary per device, with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions provided to the RSL) can facilitate electrical conductivity through at least a subset of the RSL, and a resistance of the filament-based device can be determined, as one example, by a tunneling resistance between the filament and the conductive layer.

A RSL (which can also be referred to in the art as a resistive switching media (RSM)) can comprise, e.g., an undoped amorphous Si layer, a semiconductor layer having intrinsic characteristics, a silicon nitride (e.g. SiN, $Si_3N_4$, $SiN_x$, etc.), a Si sub-oxide (e.g., $SiO_x$ wherein x has a value between 0.1 and 2), a Si sub-nitride, a metal nitride, a non-stoichiometric silicon compound, and so forth. Other examples of materials suitable for the RSL could include $Si_XGe_YO_Z$ (where X, Y and Z are respective suitable positive numbers), a silicon oxide (e.g., $SiO_N$, where N is a suitable positive number), an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number), a non-stoichiometric silicon compound and so forth, a nitride (e.g., AlN, SiN), or a suitable combination thereof. In various embodiments, the RSL includes a number of material voids or defects.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL, as introduced above. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number $0<x<2$, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: $TiN_x$, $TaN_x$, $AlN_x$, $CuN_x$, $WN_x$ and $AgN_x$, where x is a positive number. In a further embodiment(s), the active metal layer can comprise a metal oxide selected from the group consisting of: $TiO_x$, $TaO_x$, $AlO_x$, $CuO_x$, $WO_x$, and $AgO_x$. In yet another embodiment(s), the active metal layer can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiNy$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer can comprise a metal nitride: $MN_x$, e.g., $AgN_x$, $TiN_x$, $AlN_x$, etc., and the resistive switching layer can comprise a metal nitride: $MN_y$, e.g., $AgN_y$, $TiN_y$, $AlN_y$, and so forth, where y and x are positive numbers, and in some cases y is larger than x. In an alternative embodiment of this example, the particle donor layer can comprise a metal oxide: $MO_x$, e.g., $AgO_x$, $TiO_x$, $AlO_x$, etc., and the resistive switching layer can comprise a metal oxide: $MO_y$, e.g., $AgO_y$, $TiO_y$, $AlO_y$, or the like, where y and x are positive numbers, and in some cases y is larger than x. In yet another alternative, the metal compound of the particle donor layer is a $MN_x$ (e.g., $AgN_x$, $TiN_x$, AlNx, etc.), and the resistive switching layer is selected from a group consisting essentially of $MO_y$ (e.g., $AgO_y$, $TiO_y$, $AlO_y$, etc.) and $SiO_y$, where x and y are typically non-stoichiometric values.

As utilized herein, variables x, a, b, and so forth representative of values or ratios of one element with respect to another (or others) in a compound can have different values suitable for respective compounds, and are not intended to denote a same or similar value or ratio among the compounds. Details pertaining to additional embodiments of the subject disclosure similar to the foregoing example(s) can be found in the following U.S. patent applications that are licensed to the assignee of the present application for patent: application Ser. No. 11/875,541 filed Oct. 19, 2007, application Ser. No. 12/575,921 filed Oct. 8, 2009, and the others cited herein, each of which are incorporated by reference herein in their respective entireties and for all purposes.

FIG. 1 depicts an example non-volatile two-terminal memory device 100. Device 100 can include top electrode (TE) 102 and an active metal layer 103 as detailed herein. In some embodiments, TE 102 can be or can comprise active metal layer 103. Device 100 can also include interface layer 104 that can be substantially similar to the RSL described herein. Device 100 can include bottom electrode 106.

In some embodiments, BE 106 can be formed on or overly substrate 108. In some embodiments, intervening layers (not shown) such as a metal layer can be formed between BE 106 and substrate 108. In some embodiments, BE 106 and potentially other portions of device 100 can be formed in front-end-of-line processing layers over substrate 108 and/or over one or more optional intervening layers. In some embodiments, BE 106 or potentially other portions of device 100 can be formed in back-end-of-line processing layers over substrate 108 and/or one or more intervening layers. In some embodiments, BE 106 or other portions of device 100 can be provided as part of another suitable integrated circuit fabrication process.

Volatile resistive technology can operate according to similar principles as non-volatile resistive technology with certain notable distinctions. For example, in absence of the external stimuli, filament-forming particles driven into the active region (e.g., select layer 204) of volatile devices typically retreat back to the conductive contact source. Hence, the change in the state of the device caused by the external stimuli does not remain after the external stimuli are removed. This distinction exists due in part to a difference in design of the active region or other portions of the device. For instance, while non-volatile resistive-switching two-terminal memory cells tend to have active regions with a high number of defect sites (to trap ionized particles), corresponding active regions of volatile resistive-switching devices have few or fewer defect sites to trap the filament-forming particles. As used herein, the terms "high", "low", "many", and "few" or similar, when used in connection with a number of defect sites are intended to expressly define, distinguish, or relate to a threshold between volatile and non-volatile resistive-switching devices. For example, a non-volatile device can be said to have a high number of defect sites in the active region (e.g., interface layer 104) because that number of defects sites is sufficient to maintain the conductive filament when the external stimuli that created the conductive filament are removed. Conversely, a volatile device can be said to have few defect sites in the active region because the existing number of defect sites is not sufficient to maintain the conductive filament when the external stimuli that created the conductive filament are removed.

While volatile resistive-switching devices typically do not provide for long-term memory storage as do non-volatile memory, volatile resistive-switching devices can provide numerous benefits. As an example, volatile resistive-switching devices can be wired in series with non-volatile memory to, e.g., minimize leak current or improve sensing margin. Some details pertaining to such embodiments can be found in the following U.S. patent application assigned to the assignee of the present application for patent: application Ser. No. 14/588,185, filed Dec. 31, 2014, which is incorporated by reference herein in its entirety and for all purposes. As another example, volatile resistive-switching devices can operate to store memory (e.g., in a volatile manner) or perform logic operations, and can function in both bipolar and unipolar designs.

As utilized herein, the selector device will generally have very high ratio of on current (e.g., when the selector device has low electrical resistance) to off current (e.g., when the selector device has high electrical resistance). This ratio of on current to off current is also referred to herein as an on/off current ratio. As an illustrative example, the selector device can be a FAST™ selector device under development by the current assignee of the present application for patent, although other selector devices can be employed consistent with one or more embodiments as well.

A filamentary selector device can exhibit a first state (e.g., a first electrical resistance, or other suitable measurable characteristic) in the absence of a suitable external stimulus. The stimulus can have a threshold value or range of such values that induces the filamentary selector device to change from the first state to a second state while the stimulus is applied. In response to the stimulus falling below the threshold value (or threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli. As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

In some embodiments, and by way of example, a disclosed filamentary based selector device can form a conductive path or filament through a relatively high resistive portion in response to a suitable external stimulus. The external stimulus can cause metallic particles within an active metal layer to migrate within (or ionize within) a RSL layer of the filamentary selector device. As mentioned above, the RSL can be selected to have relatively few physical defect locations for the volatile filamentary switching device, facilitating relatively good mobility of the metallic particles within the RSL. Accordingly, below an associated threshold stimulus (or narrow range of threshold values), the metallic particles can be dispersed within the RSL to prevent formation of a sufficient conductive path through the RSL to lower a high resistance associated with the first state. Above the threshold, the external stimulus maintains the metallic particles in sufficient formation to provide the conductive path, leading to relatively low resistance of the second state. An analogous mechanism can control operation of the third state in the bipolar context.

For a non-volatile filamentary-based memory cell, an RSL can be selected to have sufficient physical defect sites therein so as to trap particles in place in the absence of a suitable external stimulus, mitigating particle mobility, such as drift or dispersion. In response to a suitable program voltage applied across the memory cell, a conductive path or a filament forms through the RSL. In particular, upon application of a programming bias voltage, metallic ions are generated from the active metal layer and migrate into the RSL layer. More specifically, metallic ions migrate to the voids or defect sites within the RSL layer. In some embodiments, upon removal of the bias voltage, the metallic ions become neutral metal particles and remain trapped in voids or defects of the RSL layer. When sufficient particles become trapped, a filament is formed and the memory cell switches from a relatively high resistive state, to a relatively low resistive state. More specifically, the trapped metal particles provide the conductive path or filament through the RSL layer, and the resistance is typically determined by a tunneling resistance through the RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the RSL become mobile and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures in addition to resistive memory. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. Though resistive-switching memory technology is referred to with many of the embodiments disclosed herein, other two-terminal memory technologies can be utilized for some of the disclosed embodiments, where suitable to one of ordinary skill in the art.

With specific reference to FIG. 2, example volatile two-terminal selector device 200 is depicted. Device 200 can comprise select layer 204 that can represent all or a portion of the active region detailed herein and can be sandwiched between two active metal layers, top active metal layer 203 and bottom active metal layer 205 and/or two electrodes, TE 202 and BE 206. Metal layers 203 and 205 can respectively comprise the same materials or different materials depending on the implementation. In some embodiments, TE 202 can be or can comprise top active metal layer 203. In some embodiments, BE 206 can be or can comprise bottom active metal layer 206. In some embodiments, device 200 can optionally comprise substrate 208, which can be substantially similar to substrate 108 detailed herein and, potentially, intervening layers, as detailed.

Figure 3:
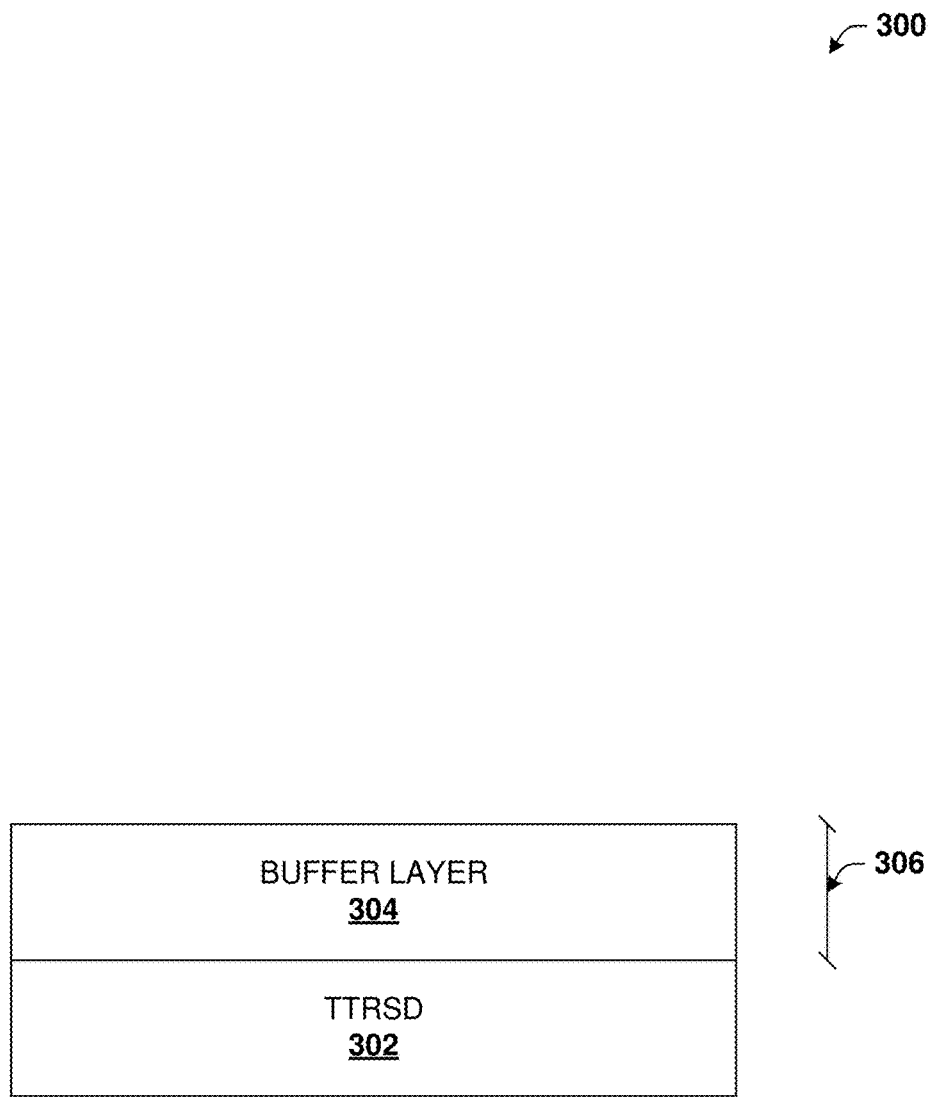
FIG. 3 depicts an example cross-section view of an integrated circuit device comprising a TTRSD with a buffer layer in accordance with certain embodiments of this disclosure.

It is understood that both devices 100, 200 can serve as examples of a two-terminal resistive switching device such as TTRSD 302 illustrated in FIG. 3 and other figures herein.

Turning now to FIG. 3, illustrated is an example cross-section view of an integrated circuit device 300 comprising a TTRSD 302 with a buffer layer 304. TTRSD 302 can represent substantially any two-terminal resistive switching device and can be, e.g., a non-volatile two-terminal memory device, an example of which is illustrated by device 100 of FIG. 1; a volatile two-terminal selector device, an example of which is illustrated by device 200 of FIG. 2; or another suitable device.

In various embodiments, TTRSD 302 may be disposed upon an insulating substrate, an interlayer dielectric, an intermetal dielectric, or the like. As merely an example, TTRSD 302 may be a structure disclosed in U.S. patent application Ser. No. 14/636,363, referenced above, or may be formed using techniques disclosed therein, A method or process for constructing integrated circuit device 300 can comprise forming layers of a two-terminal resistive switching device 302 (e.g., layers of device 100 or device 200 or another suitable device) and forming buffer layer 304 overlaying and in contact with a top electrode (e.g., TE 102 or TE 202) of the layers of TTRSD 302. In some embodiments, this top electrode can comprise silver (Ag) or aluminum (Al), an aluminum or silver alloy, an aluminum or silver compound, or the like. In some embodiments, buffer layer 304 can comprise titanium nitride (TiN). In some embodiments, a thickness 306 of buffer layer 304 can be a range of between about 100 angstroms to about 150 angstroms. In some embodiments, buffer layer 304 can be formed by way of a physical vapor deposition (PVD) process.

Figure 4:
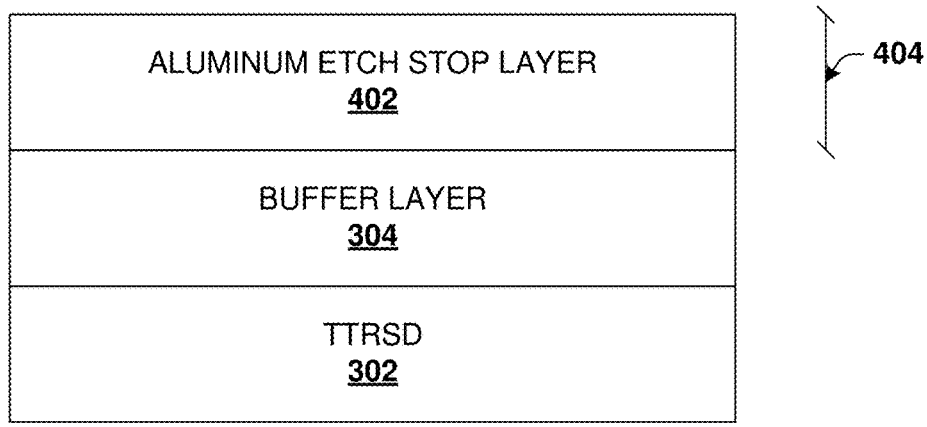
FIG. 4 depicts an example cross-section view of an integrated circuit device comprising a TTRSD, a buffer layer, and an aluminum etch stop layer in accordance with certain embodiments of this disclosure.

Referring now to FIG. 4, illustrated is an example cross-section view of an integrated circuit device 400 comprising TTRSD 302, buffer layer 304, and an aluminum etch stop layer 402. A method or process for constructing integrated circuit device 400 can comprise the method or process for constructing integrated circuit device 300 and further comprise forming etch stop layer 402 comprising aluminum overlaying and in contact with buffer layer 304. In some embodiments, aluminum etch stop layer 402 can comprise other material in addition to aluminum. In some embodiments, aluminum etch stop layer 402 can comprise material that is substantially identical or substantially similar to material of an electrode of TTRSD 302, for example, TE 102 or 202. In some embodiments, a thickness 404 of aluminum etch stop layer 402 can be a range of between about 100 angstroms to about 200 angstroms. In some embodiments, aluminum etch stop layer 402 can be formed by way of a PVD process.

Figure 5:
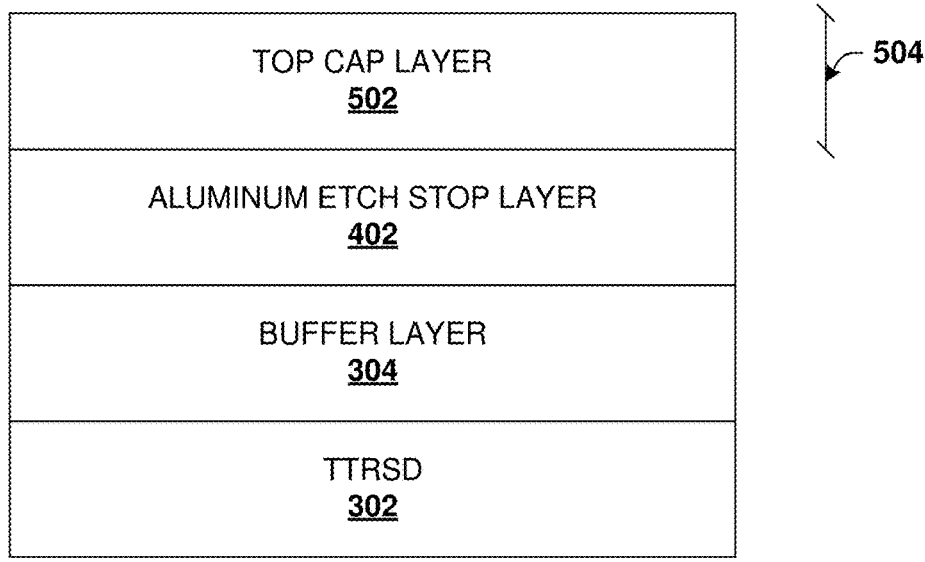
FIG. 5 depicts an example cross-section view of an integrated circuit device comprising a TTRSD, a buffer layer, an aluminum etch stop layer, and a top cap layer in accordance with certain embodiments of this disclosure.

Turning now to FIG. 5, illustrated is an example cross-section view of a integrated circuit device 500 comprising TTRSD 302, buffer layer 304, an aluminum etch stop layer 402, and a top cap layer 502. A method or process for constructing integrated circuit device 500 can comprise the method or process for constructing integrated circuit device 400 and further comprise forming top cap layer 502 overlaying and in contact with aluminum etch stop layer 402. In some embodiments, top cap layer 502 can comprise TiN, TaN, or the like. In some embodiments, a thickness 504 of top cap layer 502 can be a range of between about 300 angstroms to about 500 angstroms. In some embodiments, top cap layer 502 can be formed by way of a PVD process.

Figure 6:
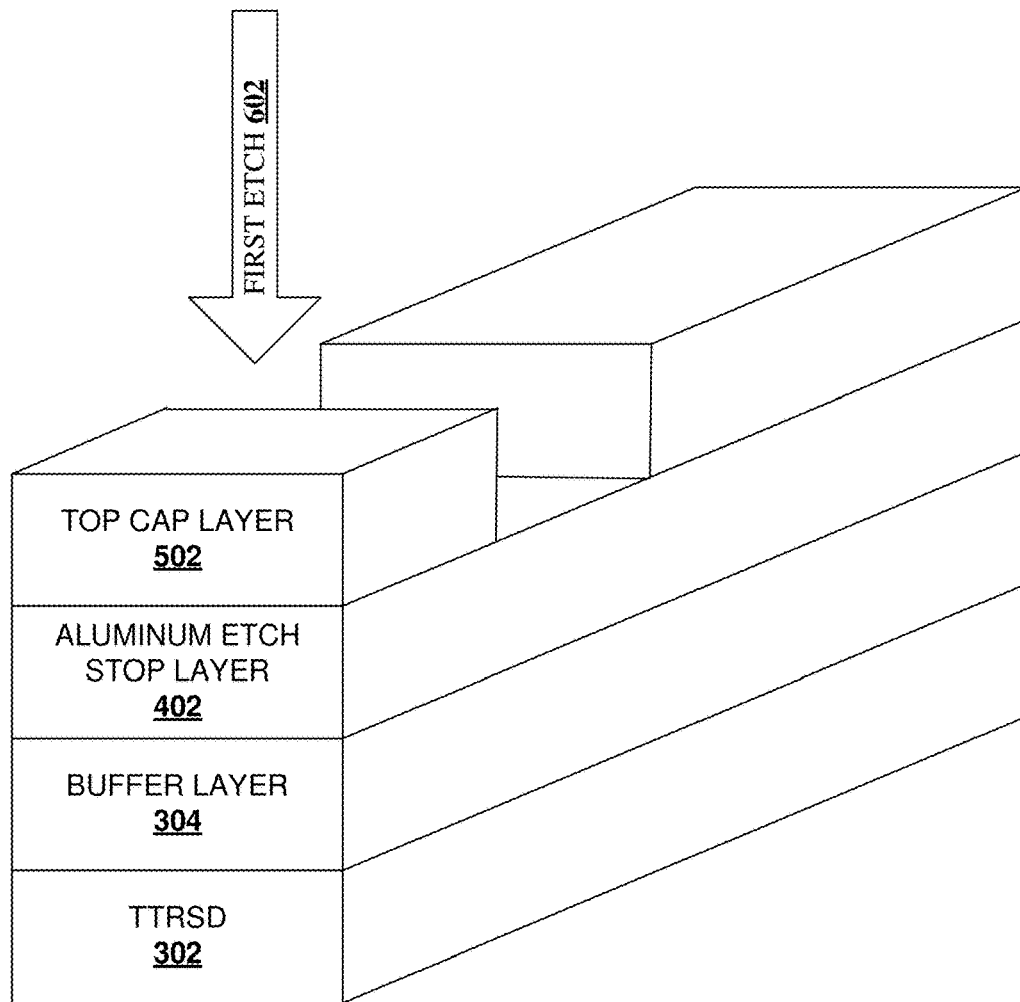
FIG. 6 depicts an example three-dimensional (3D) view showing a first etching procedure in accordance with certain embodiments of this disclosure.

With reference now to FIG. 6, Illustration 600 is depicted. Illustration 600 depicts an example 3D view showing a first etching procedure 602. It is understood that the example 3D view depicts a 3D view of integrated circuit device 500 after first etching procedure 602 has completed. As illustrated, first etching procedure 602 can substantially remove a portion of top cap layer 502. In some embodiments, first etching procedure 602 can be a chemical etch procedure that employs, e.g., boron trichloride ($BCl_3$), chlorine (Cl), or a compound comprising Cl, $Cl_2$, $BCl_3$, or other chlorine compound. As detailed, top cap layer 502 can comprise TiN and in various embodiments, the general mechanism for removing TiN is via a chemical etch that employs $BCl_3$, Cl, or the like.

It can be undesirable for active metal portions (e.g., TE 102, 202) of TTRSD 302 to come in contact with chlorine-based chemicals that can be utilized with first etching procedure 602. Accordingly, in various embodiments, once at least some portion of aluminum etch stop layer 402 is exposed by first etching procedure 602, a chemical signature can be detected that is used to begin termination of first etching procedure 602. For example, the signal can be based on spectral emissions that indicate the presence of aluminum material from aluminum stop etch layer 402. Generally, aluminum etch stop layer 402 will be thick enough (e.g., thickness 404) to ensure that first etching procedure 602 does not completely penetrate aluminum etch stop layer 402 and/or expose buffer layer 304. Accordingly, aluminum etch stop layer 402 can serve as a barrier to protect the active metal of a TE of TTRSD 302. When aluminum from aluminum etch stop layer 402 is detected and first etching procedure 602 is terminated, it is appreciated that all or substantially all of the portion of top cap layer 502 being etched will be successfully removed. Although not depicted, it is possible that some, but ideally not all, of aluminum etch stop layer 402 will also have been removed.

Figure 7:
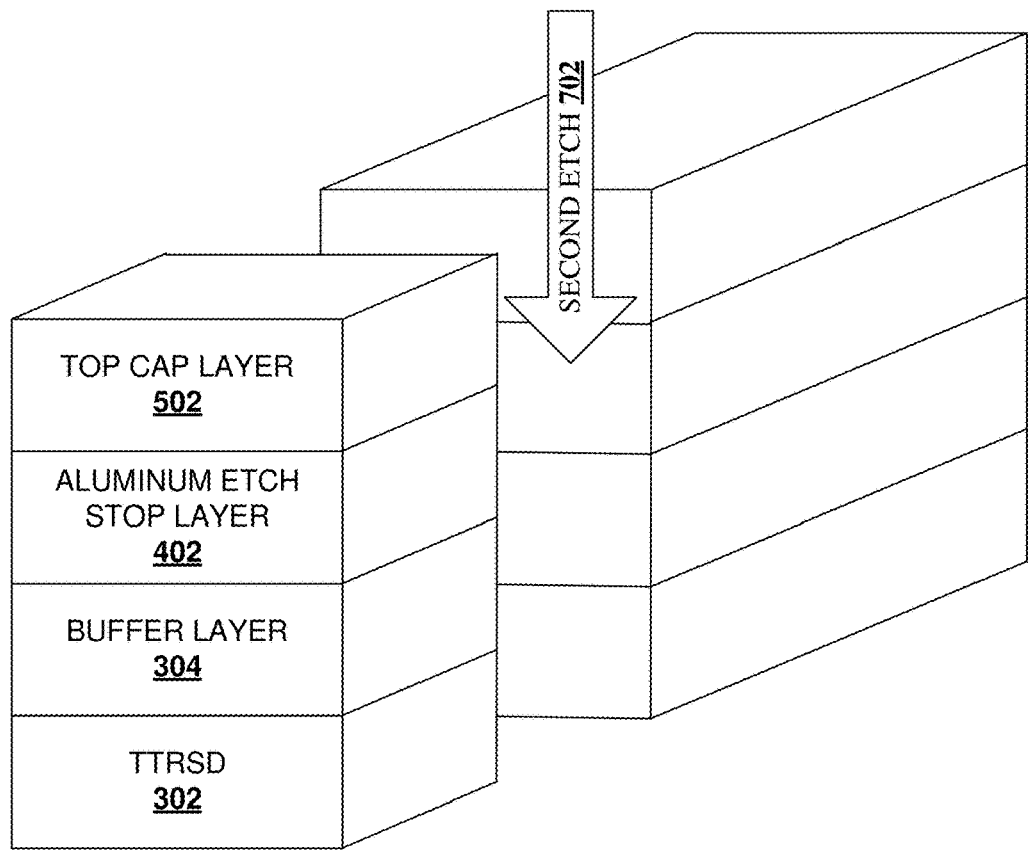
FIG. 7 illustrates an example 3D view showing a second etching procedure in accordance with certain embodiments of this disclosure.

Turning now to FIG. 7, illustration 700 depicts an example 3D view showing a second etching procedure 702. In some embodiments, second etching procedure 702 can be a physical etch, e.g., an argon plasma, $H_2$ plasma etch, or the like. A notable difference between first etching procedure 602 and second etching procedure 702 is that second etching procedure 702 can be configured to mitigate undesired alteration or harm to active metal (e.g., silver, aluminum, etc.) properties of one or more terminals/electrodes of TTRSD 302. Hence, second etching procedure 702 can be used to safely remove portions of some of the underlying layers. Such can include portions of top cap layer 502 and aluminum etch stop layer 402 that remain after first etching procedure 602. In some embodiments, second etching procedure 702 may remove portions of buffer layer 304 and some portions of TTRSD 302. As an example, second etching procedure 702 may etch some or all of the layers in TTRSD 100 including: top electrode 102, active metal layer 103, interface layer 104 and bottom electrode 106; second etching procedure 702 may etch some or all of the layers in TTRSD 200 including: top electrode 201, top active metal layer 203, select layer 204, bottom active metal layer 205 and bottom electrode 206. In various embodiments, second etching procedure 702 may include one or more physical etch processes that etch one or more of the layers described above.

In various embodiments, buffer layer 304, aluminum etch stop layer 402 and top cap layer 502 may be used as a barrier material layer 412 in FIG. 4B in the structure disclosed in U.S. patent application Ser. No. 14/636,363, referenced above.

The diagrams included herein are described with respect to interaction between several components (e.g., layers) of a memory device or an integrated circuit device, or memory architectures comprising one or more memory devices or integrated circuit devices. It should be appreciated that such diagrams can include those components, layers, devices and architectures specified therein, some of the specified components/layers/devices, or additional components/layers/devices. Sub-components can also be implemented as electrically connected to other sub-components rather than included within a parent device. Additionally, it is noted that one or more disclosed processes can be combined into a single process providing aggregate functionality. For instance, a deposition process can comprise an etching process, or vice versa, to facilitate depositing and etching a component of an integrated circuit device by way of a single process. Components of the disclosed architectures can also interact with one or more other components not specifically described herein but known by those of skill in the art.

Figure 8:
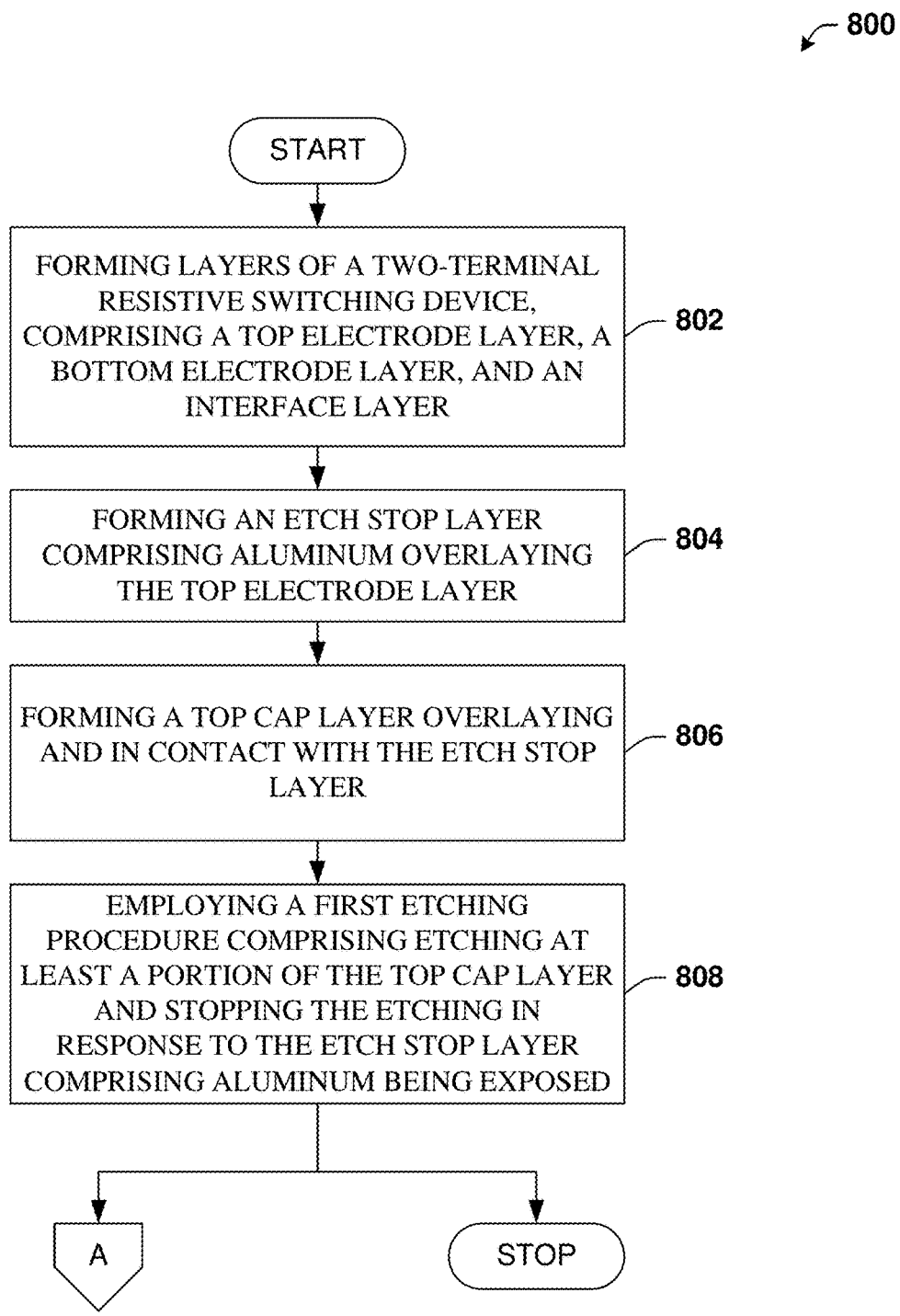
FIG. 8 illustrates an exemplary flow chart of procedures relating to employing an etched stop layer comprising aluminum in connection with fabrication of a two-terminal resistive switching device in accordance with certain embodiments of this disclosure.
Figure 9:
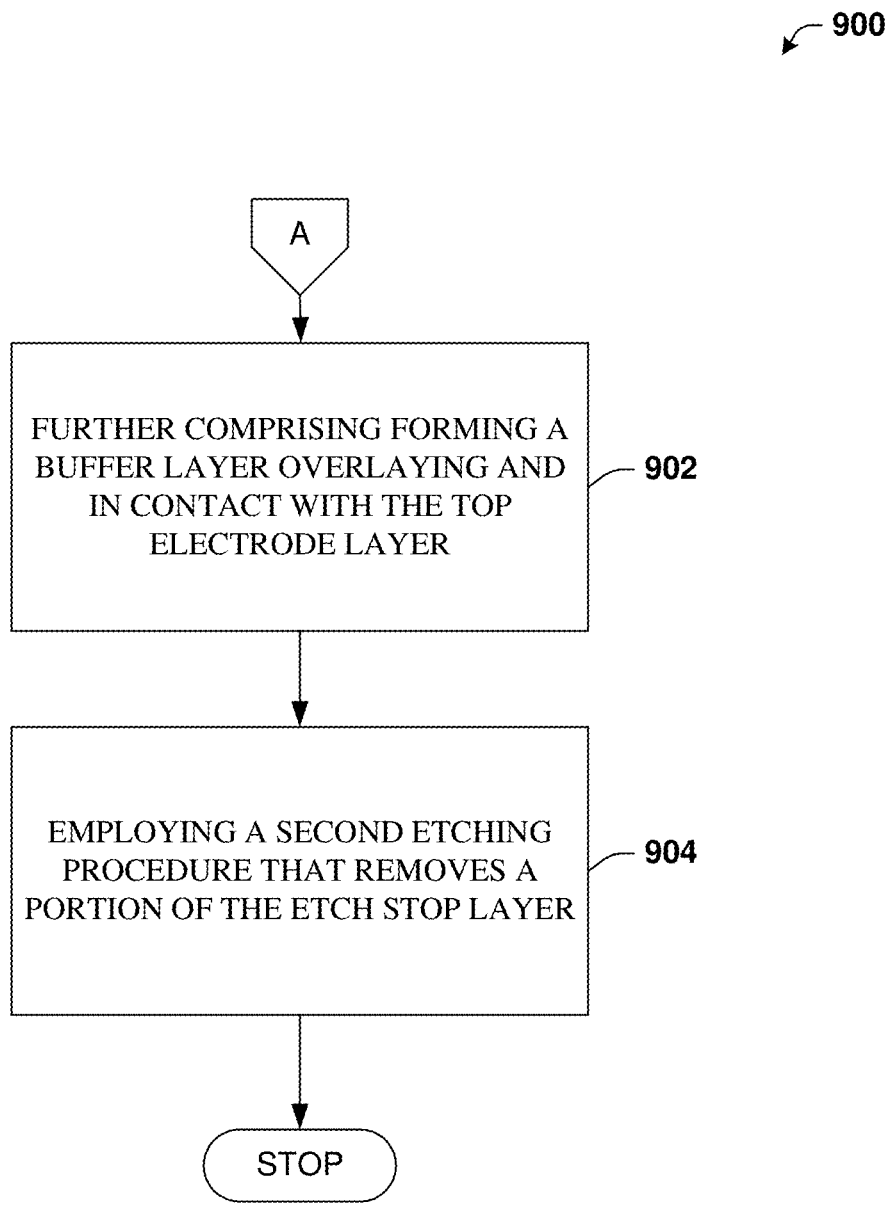
FIG. 9 illustrates an exemplary flow chart of procedures relating to additional aspects or elements in connection with fabrication of a two-terminal resistive switching device in accordance with certain embodiments of this disclosure.

In view of the exemplary diagrams described supra, process methods that can be implemented in accordance with the disclosed subject matter will be better appreciated with reference to the flow charts of FIGS. 8-9. While for purposes of simplicity of explanation, the methods of FIGS. 8-9 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 8, exemplary method 800 is illustrated. Method 800 can relate to employing an etched stop layer comprising aluminum in connection with fabrication of a two-terminal resistive switching device. For example, at reference numeral 802, a TTRSD fabrication device can form various layers that can serve as layers or elements of an integrated circuit device such as a two-terminal resistive switching device. For instance, the layers can include a top electrode layer, a bottom electrode layer, an interface layer, and other suitable layers. The top electrode layer can serve as a top electrode element when the TTRSD has been fabricated (e.g., patterned and etched from the layers), the bottom electrode layer that can serve as a bottom electrode element, and the interface layer that can serve as a switching element. In some embodiments, the TTRSD can be a two-terminal memory device. In some embodiments, the TTRSD can be a two-terminal selector device. In some embodiments, the TTRSD can be a volatile switching device that does not permanently retain a current state in the absence of power, while in other embodiments, the TTRSD can be a non-volatile switching device.

At reference numeral 804, the fabrication device can form an etch stop layer that can overlay the top electrode layer. The etch stop layer can comprise aluminum. In some embodiments, the etch stop layer can be in contact with the top electrode layer. In other embodiments, intervening layers can be disposed between the etch stop layer and the top electrode layer. In some embodiments, the etch stop layer can have a layer thickness in a range between about 100 angstroms to about 200 angstroms.

At reference numeral 806, the fabrication device can form a top cap layer. The top cap layer can be overlaying and in contact with the etch stop layer. In some embodiments, the top cap layer can comprise titanium nitride (TiN). In some embodiments, the top cap layer can have a layer thickness in a range of between about 300 angstroms to about 500 angstroms.

At reference numeral 808, the fabrication device can employ a first etching procedure. The first etching procedure can comprise etching at least a portion of the top cap layer. In some embodiments, the first etching procedure can be a chemical etching procedure that employs certain chemicals to erode or remove material of the various layers. In some embodiments, the first etching procedure can employ a chemical etchant comprising chlorine. In some embodiments, the chemical etchant can be boron trichloride ($BCl_3$), chlorine (Cl), a compound comprising Cl, $Cl_2$, or $BCl_3$, or other suitable etchants.

The first etching procedure can further comprise stopping the etching in response to the etch stop layer comprising aluminum has been exposed. For example, when the presence of aluminum is detected in the etching environment, such can be an indicator that the etch stop layer has been reached and/or exposed, which can signal that the first etching procedure is to terminate. Method 800 can stop, or can proceed to insert A, which is further detailed in connection with FIG. 9.

Turning now to FIG. 9, exemplary method 900 is illustrated. Method 900 can relate to additional aspects or elements in connection with fabrication of a two-terminal resistive switching device. For example, at reference numeral 902, the fabrication device can form a buffer layer overlaying and in contact with the top electrode layer. In some embodiments, the buffer layer can be in contact with the top cap layer as well as the top electrode layer. In some embodiments, intervening layers can exist between the buffer layer and one or more of the top cap layer and the top electrode layer. In some embodiments, the buffer layer can comprise TiN. In some embodiments, the buffer layer can have a thickness in a range of between about 100 angstroms to about 150 angstroms.

At reference numeral 904, the fabrication device can employ a second etching procedure that removes a portion of some or all remaining layers such as those layers that are beneath the top cap layer or some portion of the top cap layer should any remain at the areas where the first etching procedure was applied. For example, the fabrication device can remove a portion of the etch stop layer. In embodiments where the buffer layer is present, the second etching procedure can remove portions of the buffer layer. In some embodiments, the second etching procedure can remove portions of the layers adjacent to the TTRSD.

Example Operating Environments

Figure 10:
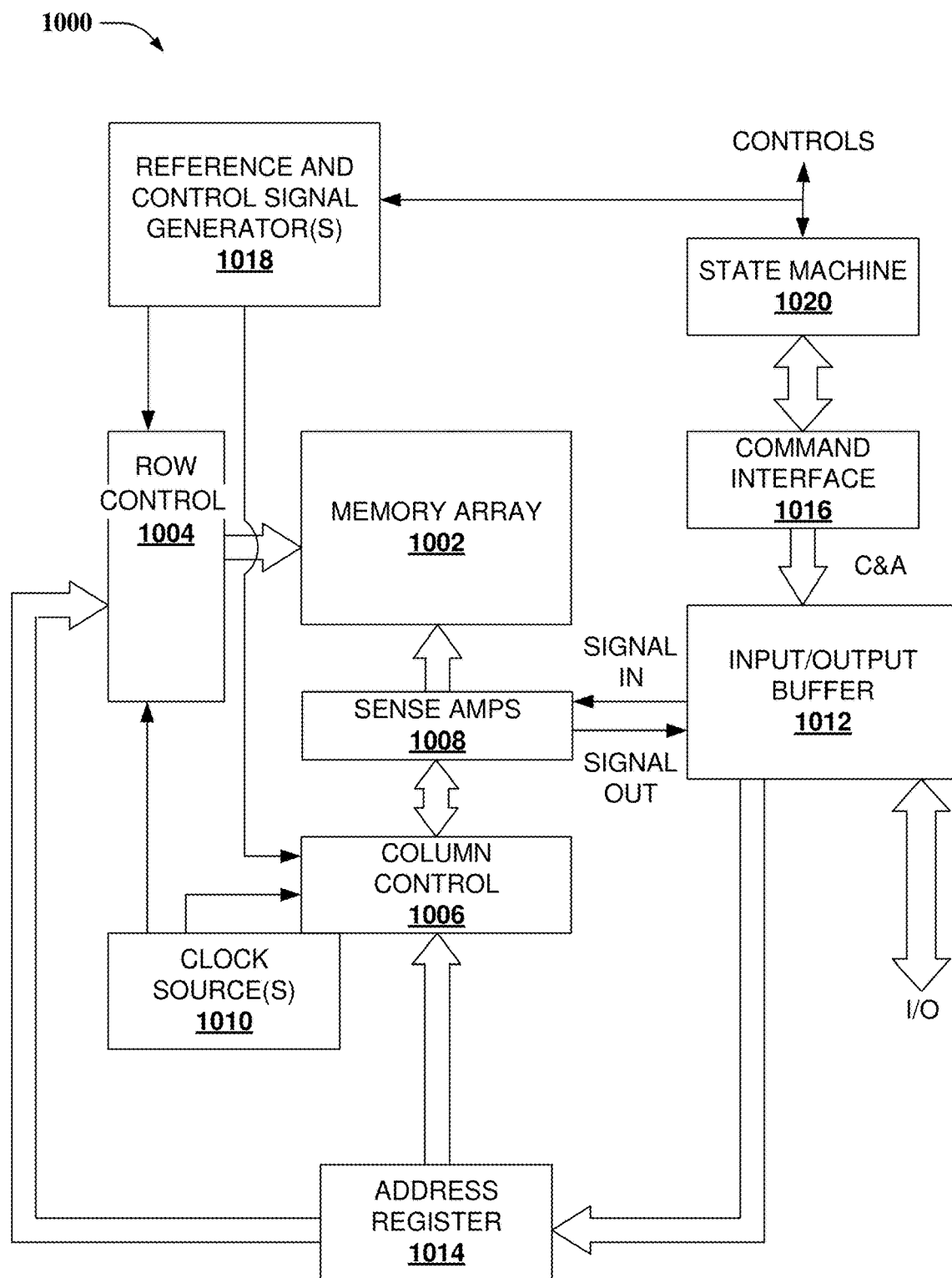
FIG. 10 illustrates a block diagram of an example electronic operating environment in accordance with certain embodiments of this disclosure.

FIG. 10 illustrates a block diagram of an example operating and control environment 1000 for a memory array 1002 of a memory cell array according to aspects of the subject disclosure. In at least one aspect of the subject disclosure, memory array 1002 can comprise memory selected from a variety of memory cell technologies. In at least one embodiment, memory array 1002 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing.

A column controller 1006 and sense amps 1008 can be formed adjacent to memory array 1002. Moreover, column controller 1006 can be configured to activate (or identify for activation) a subset of bit lines of memory array 1002. Column controller 1006 can utilize a control signal provided by a reference and control signal generator(s) 1018 to activate, as well as operate upon, respective ones of the subset of bitlines, applying suitable program, erase or read voltages to those bitlines. Non-activated bitlines can be kept at an inhibit voltage (also applied by reference and control signal generator(s) 1018), to mitigate or avoid bit-disturb effects on these non-activated bitlines.

In addition, operating and control environment 1000 can comprise a row controller 1004. Row controller 1004 can be formed adjacent to and electrically connected with word lines of memory array 1002. Also utilizing control signals of reference and control signal generator(s) 1018, row controller 1004 can select particular rows of memory cells with a suitable selection voltage. Moreover, row controller 1004 can facilitate program, erase or read operations by applying suitable voltages at selected word lines.

Sense amps 1008 can read data from, or write data to the activated memory cells of memory array 1002, which are selected by column control 1006 and row control 1004. Data read out from memory array 1002 can be provided to an input/output buffer 1012. Likewise, data to be written to memory array 1002 can be received from the input/output buffer 1012 and written to the activated memory cells of memory array 1002.

A clock source(s) 1008 can provide respective clock pulses to facilitate timing for read, write, and program operations of row controller 1004 and column controller 1006. Clock source(s) 1008 can further facilitate selection of word lines or bit lines in response to external or internal commands received by operating and control environment 1000. Input/output buffer 1012 can comprise a command and address input, as well as a bidirectional data input and output. Instructions are provided over the command and address input, and the data to be written to memory array 1002 as well as data read from memory array 1002 is conveyed on the bidirectional data input and output, facilitating connection to an external host apparatus, such as a computer or other processing device (not depicted, but see e.g., computer 1002 of FIG. 10, infra).

Input/output buffer 1012 can be configured to receive write data, receive an erase instruction, receive a status or maintenance instruction, output readout data, output status information, and receive address data and command data, as well as address data for respective instructions. Address data can be transferred to row controller 1004 and column controller 1006 by an address register 1010. In addition, input data is transmitted to memory array 1002 via signal input lines between sense amps 1008 and input/output buffer 1012, and output data is received from memory array 1002 via signal output lines from sense amps 1008 to input/output buffer 1012. Input data can be received from the host apparatus, and output data can be delivered to the host apparatus via the I/O bus.

Commands received from the host apparatus can be provided to a command interface 1016. Command interface 1016 can be configured to receive external control signals from the host apparatus, and determine whether data input to the input/output buffer 1612 is write data, a command, or an address. Input commands can be transferred to a state machine 1020.

State machine 1020 can be configured to manage programming and reprogramming of memory array 1002 (as well as other memory banks of a multi-bank memory array). Instructions provided to state machine 1020 are implemented according to control logic configurations, enabling state machine to manage read, write, erase, data input, data output, and other functionality associated with memory cell array 1002. In some aspects, state machine 1020 can send and receive acknowledgments and negative acknowledgments regarding successful receipt or execution of various commands. In further embodiments, state machine 1020 can decode and implement status-related commands, decode and implement configuration commands, and so on.

To implement read, write, erase, input, output, etc., functionality, state machine 1020 can control clock source(s) 1008 or reference and control signal generator(s) 1018. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

In connection with FIG. 11, the systems, devices, and/or processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 11:
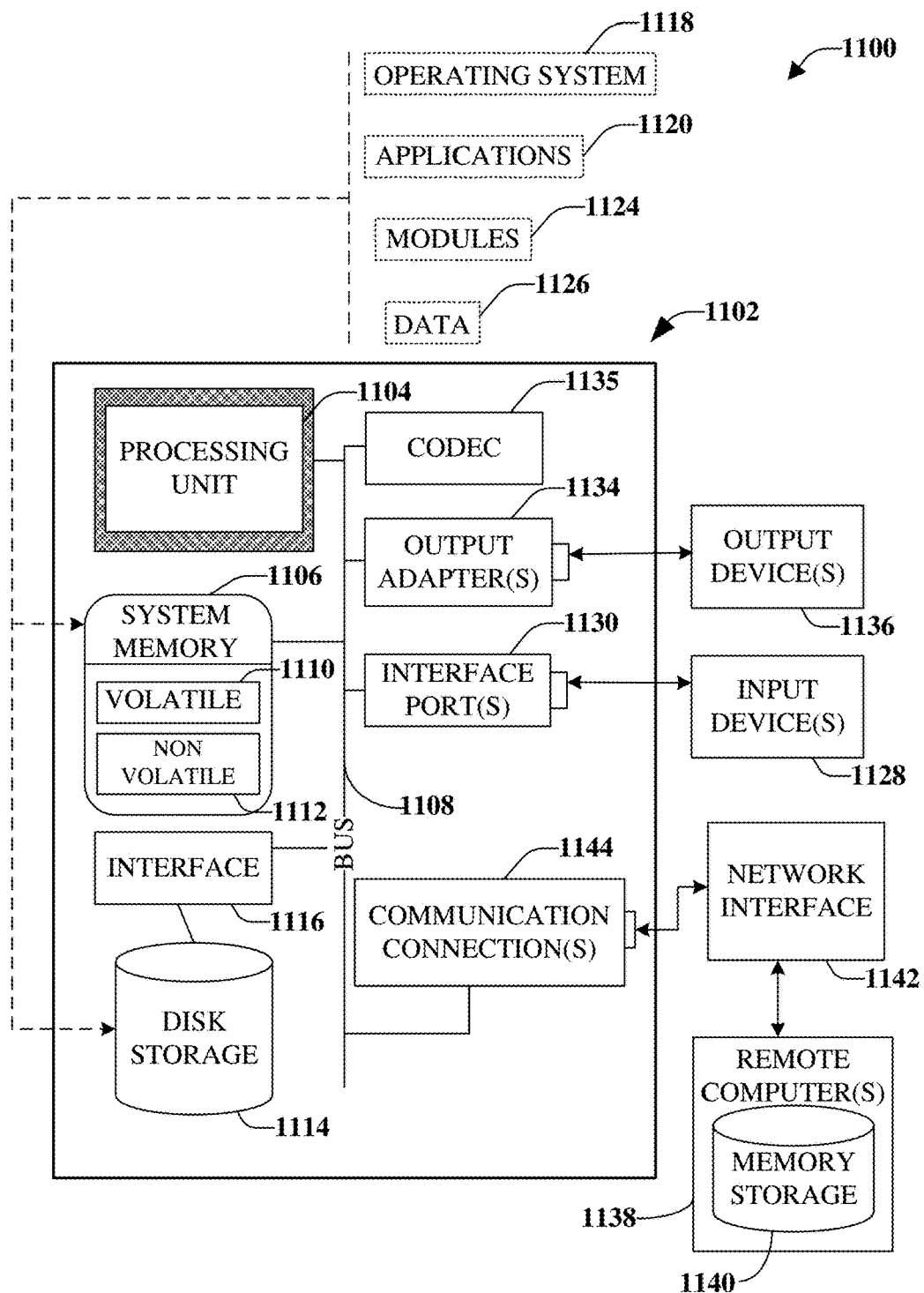
FIG. 11 illustrates a block diagram of an example computing environment in accordance with certain embodiments of this disclosure.

With reference to FIG. 11, a suitable environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors and other multiprocessor architectures also can be employed as the processing unit 1104.

The system bus 1108 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1106 includes volatile memory 1110 and non-volatile memory 1112, which can employ one or more of the disclosed memory architectures, in various embodiments. The basic input/output system (BIOS), containing the basic routines to transfer information between elements within the computer 1102, such as during start-up, is stored in non-volatile memory 1112. In addition, according to present innovations, codec 1135 may include at least one of an encoder or decoder, wherein the at least one of an encoder or decoder may consist of hardware, software, or a combination of hardware and software. Although, codec 1135 is depicted as a separate component, codec 1135 may be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), or Flash memory. Non-volatile memory 1112 can employ one or more of the disclosed memory devices, in at least some embodiments. Moreover, non-volatile memory 1112 can be computer memory (e.g., physically integrated with computer 1102 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1110 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1102 may also include removable/non-removable, volatile/non-volatile computer storage medium. FIG. 11 illustrates, for example, disk storage 1114. Disk storage 1114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1114 to the system bus 1108, a removable or non-removable interface is typically used, such as interface 1116. It is appreciated that storage devices 1114 can store information related to a user. Such information might be stored at or provided to a server or to an application running on a user device. In one embodiment, the user can be notified (e.g., by way of output device(s) 1136) of the types of information that are stored to disk storage 1114 or transmitted to the server or application. The user can be provided the opportunity to opt-in or opt-out of having such information collected or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer system 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port may be used to provide input to computer 1102 and to output information from computer 1102 to an output device 1136. Output adapter 1134 is provided to illustrate that there are some output devices 1136 like monitors, speakers, and printers, among other output devices 1136, which require special adapters. The output adapters 1134 include, by way of illustration and not limitation, video and sound cards that provide a means of connection between the output device 1136 and the system bus 1108. It should be noted that other devices or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1144 refers to the hardware/software employed to connect the network interface 1142 to the bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method, comprising:
   forming layers of a two-terminal resistive switching device;
   forming a buffer layer overlaying and in contact with a top electrode layer of the layers of the two-terminal resistive switching device, wherein the top electrode layer at least in part comprises an aluminum material;
   forming an etch stop layer comprising at least in part the aluminum material and overlaying and in contact with the buffer layer;
   forming a top cap layer comprising TiN or TaN overlaying and in contact with the etch stop layer;
   etching with a first etch procedure of a two-step etch at least a portion of the top cap layer and terminating the first etch procedure when the etch stop layer comprising aluminum is reached, wherein the first etch procedure comprises employing a chemical etch procedure, and wherein the terminating the etching comprises terminating the chemical etch procedure in response to an indication that the aluminum of the etch stop layer has been exposed; and
   etching with a second etch procedure of the two-step etch a portion of the etch stop layer exposed by the first etch procedure and respective portions of the buffer layer and of the top electrode layer underlying the portion of the etch stop layer.

2. The method of claim 1, wherein the two-terminal resistive switching device is a non-volatile two-terminal memory device.

3. The method of claim 1, wherein the forming the layers of the two-terminal resistive switching device comprises forming the top electrode layer from a material selected from a group consisting of: aluminum (Al), an aluminum compound, and an aluminum mixture.

4. The method of claim 1, wherein the buffer layer comprises titanium nitride (TiN) and the top cap layer comprises TiN.

5. The method of claim 1, wherein the forming the buffer layer further comprises providing the buffer layer with a thickness in a first range of between 100 angstroms to 150 angstroms, and wherein the forming the etch stop layer further comprises providing the etch stop layer with a thickness in a second range of between 100 angstroms to 200 angstroms, and wherein the forming the top cap layer comprises providing the top cap layer with a thickness in a third range of between 300 angstroms to 500 angstroms.

6. The method of claim 1, further comprising determining the indication that aluminum of the etch stop layer has been exposed using a spectral emission measurement device.

7. The method of claim 1, wherein the employing the chemical etch procedure further comprises employing an etchant selected from a group consisting of: boron trichloride ($BCl_3$), chlorine (Cl), and a compound comprising Cl, $Cl_2$, or $BCl_3$.

8. The method of claim 1, wherein the second etch procedure comprises a physical etch procedure utilizing an argon plasma etch or a $H_2$ plasma etch that removes the portion of the etch stop layer and the respective portions of the buffer layer and of the top electrode layer.

9. The method of claim 8, wherein the implementing the second etch procedure comprising the physical etch procedure further comprises removing respective portions of materials of all of the layers of the two-terminal resistive switching device underlying the portion of the etch stop layer exposed by the etching of the portion of the top cap layer.

10. A method, comprising:
    forming layers of a two-terminal resistive switching device, comprising a top electrode layer comprising aluminum, a bottom electrode layer, and an interface layer;
    forming an etch stop layer comprising aluminum overlaying the top electrode layer;
    forming a top cap layer from a material selected from a group consisting of: TiN and TaN overlaying and in contact with the etch stop layer;
    employing a first chemical etching procedure comprising etching at least a portion of the top cap layer and stopping the etching in response to the first chemical etching procedure exposing aluminum material of the etch stop layer; and
    employing a second etching procedure comprising removing a portion of the etch stop layer exposed by the first chemical etching procedure and a portion at least of the top electrode layer of the two-terminal resistive switching device underlying the portion of the etch stop layer.

11. The method of claim 10, further comprising forming a buffer layer overlaying and in contact with the top electrode layer.

12. The method of claim 10, wherein the employing the first chemical etching procedure further comprises employing a chemical etching procedure utilizing an etchant selected from a group consisting of: boron trichloride ($BCl_3$), chlorine (Cl), and a compound comprising Cl, $Cl_2$, or $BCl_3$.

13. The method of claim 10, wherein the second etching procedure comprises an argon plasma etch or a $H_2$ plasma etch that removes the portion of the etch stop layer and the portion at least of the top electrode layer of the two-terminal resistive switching device.

14. The method of claim 13, wherein forming the layers of the two-terminal resistive switching device further comprise forming a buffer layer overlying and in contact with the top electrode layer and underlying and in contact with the etch stop layer, wherein the employing the second etching procedure further comprises removing a portion of the buffer layer together with the portion of the etch stop layer and the portion at least of the top electrode layer of the two-terminal resistive switching device.

15. The method of claim 13, wherein the employing the second-etching procedure further comprises removing respective portions of the bottom electrode layer and the interface layer of the two-terminal resistive switching device underlying the portion of the etch stop layer exposed by the first chemical etching procedure.

16. The method of claim 14, further comprising forming the buffer layer of a second material selected from the group consisting of: TiN and TaN.

17. The method of claim 16, further comprising forming the buffer layer with a thickness in a first range of between 100 angstroms to 150 angstroms.

18. The method of claim 17, further comprising forming the etch stop layer with a second thickness in a second range of between 100 angstroms to 200 angstroms.

19. The method of claim 18, further comprising forming the top cap layer with a third thickness in a third range of between 300 angstroms and 500 angstroms.

20. The method of claim 10, further comprising utilizing the same material containing aluminum for the top electrode layer and for the etch stop layer.

* * * * *